United States Patent
Pang et al.

(10) Patent No.: US 8,946,911 B2
(45) Date of Patent: Feb. 3, 2015

(54) ELECTRODE PAD, PRINTED CIRCUIT BOARD USING THE SAME, AND METHOD OF MANUFACTURING PRINTED CIRCUIT BOARD

(71) Applicant: Samsung Electro-Mechanics Co., Ltd., Suwon (KR)

(72) Inventors: Jung Youn Pang, Suwon (KR); Shimoji Teruaki, Suwon (KR); Eun Heay Lee, Suwon (KR); Seong Min Cho, Suwon (KR); Chi Seong Kim, Suwon (KR)

(73) Assignee: Samsung Electro-Machanics Co., Ltd., Suwon (KR)

( * ) Notice: Subject to any disclaimer, the term of this patent is extended or adjusted under 35 U.S.C. 154(b) by 0 days.

(21) Appl. No.: 13/706,863

(22) Filed: Dec. 6, 2012

(65) Prior Publication Data

US 2014/0087205 A1    Mar. 27, 2014

(30) Foreign Application Priority Data

Sep. 21, 2012   (KR) .......................... 10-2012-0105298

(51) Int. Cl.
| | | |
|---|---|---|
| *H01L 23/498* | (2006.01) | |
| *B32B 15/01* | (2006.01) | |
| *B32B 15/04* | (2006.01) | |
| *C23C 18/42* | (2006.01) | |
| *C23C 28/02* | (2006.01) | |
| *C25D 5/10* | (2006.01) | |
| *C23C 18/16* | (2006.01) | |
| *C23C 18/44* | (2006.01) | |
| *C23C 18/54* | (2006.01) | |
| *H05K 3/24* | (2006.01) | |
| *H01L 23/00* | (2006.01) | |
| *C22C 5/02* | (2006.01) | |
| *C22C 5/04* | (2006.01) | |
| *C23C 18/18* | (2006.01) | |

(52) U.S. Cl.
CPC ............ *B32B 15/018* (2013.01); *B32B 15/043* (2013.01); *C23C 18/42* (2013.01); *C23C 28/021* (2013.01); *C25D 5/10* (2013.01); *C23C 18/1651* (2013.01); *C23C 18/1653* (2013.01); *C23C 18/44* (2013.01); *C23C 18/54* (2013.01); *H05K 3/244* (2013.01); *C23C 28/023* (2013.01); *H01L 24/00* (2013.01); *C22C 5/02* (2013.01); *C22C 5/04* (2013.01); *C23C 18/1844* (2013.01); *H05K 2201/09472* (2013.01)
USPC ........... 257/779; 257/750; 257/769; 257/781; 428/618; 428/669; 428/670

(58) Field of Classification Search
USPC .......... 257/779–781, 750, 769; 428/618, 669, 428/670
See application file for complete search history.

(56) References Cited

U.S. PATENT DOCUMENTS

| | | | | |
|---|---|---|---|---|
| 4,529,667 A | * | 7/1985 | Shiga et al. .................... | 428/646 |
| 5,249,728 A | * | 10/1993 | Lam ............................... | 228/111 |
| 5,587,336 A | * | 12/1996 | Wang et al. .................... | 438/17 |

(Continued)

FOREIGN PATENT DOCUMENTS

| | | |
|---|---|---|
| JP | 2009-63384 | 3/2009 |
| KR | 10-2010-007920 | 1/2010 |

*Primary Examiner* — Cathy Lam (57) ABSTRACT

There is provided an electrode pad including: a connection terminal part; a first plating layer including palladium phosphorus (Pd—P) formed on the connection terminal part; and a second plating layer including palladium (Pd) formed on the first plating layer.

12 Claims, 4 Drawing Sheets

(56) References Cited

U.S. PATENT DOCUMENTS

| | | | |
|---|---|---|---|
| 5,767,574 A * | 6/1998 | Kim et al. | 257/677 |
| 5,910,644 A * | 6/1999 | Goodman et al. | 174/260 |
| 6,784,544 B1 * | 8/2004 | Farnworth | 257/751 |
| 7,078,796 B2 * | 7/2006 | Dunn et al. | 257/690 |
| 2010/0071940 A1 | 3/2010 | Ejiri et al. | |

* cited by examiner

ELECTRODE PAD, PRINTED CIRCUIT BOARD USING THE SAME, AND METHOD OF MANUFACTURING PRINTED CIRCUIT BOARD

CROSS-REFERENCE TO RELATED APPLICATIONS

This application claims the priority of Korean Patent Application No. 10-2012-0105298 filed on Sep. 21, 2012, in the Korean Intellectual Property Office, the disclosure of which is incorporated herein by reference.

BACKGROUND OF THE INVENTION

1. Field of the Invention

The present invention relates to an electrode pad, a printed circuit board using the electrode pad, and a method of manufacturing a printed circuit board.

2. Description of the Related Art

With the trend for the miniaturization, thinning, high densification, and packetization of electronic products, a fine pattern, miniaturization, and packetization also need to be implemented in a printed circuit board.

In particular, the number of electric input and output terminals of printed circuit boards following the trend for thinning and high densification have been increased.

In order to cope with the increasing trend, a pitch of the terminal gradually follows the trend for a fine pitch.

Therefore, a method of forming a thin layer during a surface treating process of a terminal has been developed.

Recently, a method of only forming a paladium gold (Pd—Au) layer without forming a nickel (Ni) layer on a surface of a terminal has also been developed.

Generally, the case in which an electrode pad on a printed circuit board only uses a pure palladium (Pd) plating layer or a palladium phosphorus (Pd—P) plating layer is common.

However, when the electrode pad on the printed circuit board only uses the pure palladium (Pd) plating layer or the palladium phosphorus (Pd—P) plating layer, problems such as skip plating, voids and excessive plating may occur.

Patent Document 1, disclosed in the following Related Art Documents, relates to a connection terminal, a semiconductor package using the same, and a method of manufacturing the semiconductor package. Patent Document 1 discloses a conductor layer, an electroless nickel plating layer formed on the conductor layer, and a palladium (Pd) plating layer having a purity of 99 mass %, formed on the nickel (Ni) plating layer.

Patent Document 2, disclosed in the following Related Art Documents, relates to a magnetic sensor package. Patent Document 2 discloses an electrode pad that includes a copper (Cu) layer, a palladium phosphorus (Pd—P) layer formed on the copper (Cu) layer, and a gold (Au) layer formed on the palladium phosphorus (Pd—P) layer.

RELATED ART DOCUMENTS (Patent Document 1) Korean Patent Laid-Open Publication No. 2010-007920
(Patent Document 2) Japanese Patent Laid-Open Publication No. 2009-063384

SUMMARY OF THE INVENTION

An aspect of the present invention provides an electrode pad capable of suppressing the occurrence of skip plating, voids, and excessive plating, a printed circuit board using the electrode pad, and a method of manufacturing a printed circuit board.

According to an aspect of the present invention, there is provided an electrode pad, including: a connection terminal part; a first plating layer including palladium phosphorus (Pd—P) formed on the connection terminal part; and a second plating layer including palladium (Pd) formed on the first plating layer.

The connection terminal part may include copper (Cu).

A content of phosphorus (P) included in the palladium phosphorus (Pd—P) may be 0.1 to 6 wt %.

A thickness of the first plating layer may be 0.01 to 0.5 µm.

The second plating layer may be formed of pure palladium (Pd).

A thickness of the second plating layer may be 0.01 to 0.5 µm.

An electrode pad may further include a third plating layer including gold (Au) formed on the second plating layer.

A thickness of the third plating layer may be 0.01 to 0.5 µm.

According to another aspect of the present invention, there is provided a printed circuit board, including: an insulating substrate; a connection terminal part formed on the insulating substrate; a first plating layer including palladium phosphorus (Pd—P) formed on the insulating substrate and an outer side of the connection terminal part; and a second plating layer including palladium (Pd) formed on the insulating substrate and an outer side of the first plating layer.

The connection terminal part may include copper (Cu).

A content of phosphorus (P) included in the palladium phosphorus (Pd—P) may be 0.1 to 0.6 wt %.

According to another aspect of the present invention, there is provided a method of manufacturing a printed circuit board, the method including: preparing an insulating substrate; forming a connection terminal part on the insulating substrate; forming a first plating layer including palladium phosphorus (Pd—P) on the insulating substrate and an outer side of the connection terminal part; and forming a second plating layer including palladium (Pd) on the insulating substrate and an outer side of the first plating layer.

The connection terminal part may include copper (Cu).

In the forming of the first plating layer, the first plating layer may be formed by electroplating or electroless plating.

In the forming of the second plating layer, the second plating layer may be formed by electroplating or electroless plating.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 1A:
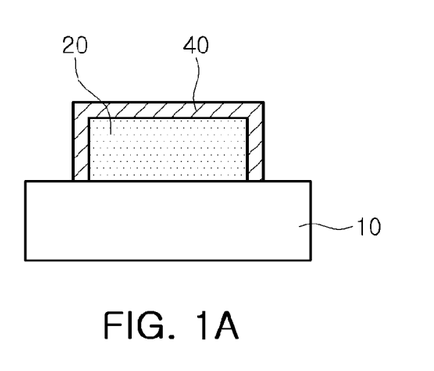
FIGS. 1A through 1C are diagrams illustrating cross sections of an electrode pad.
Figure 1B:
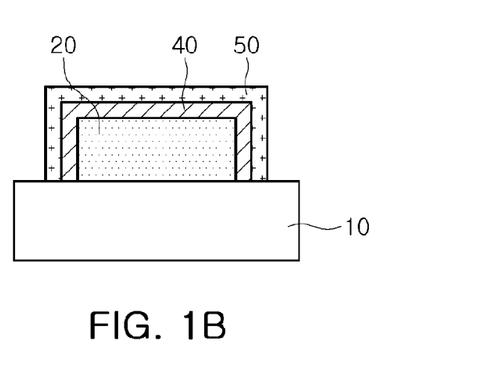
Figure 1C:
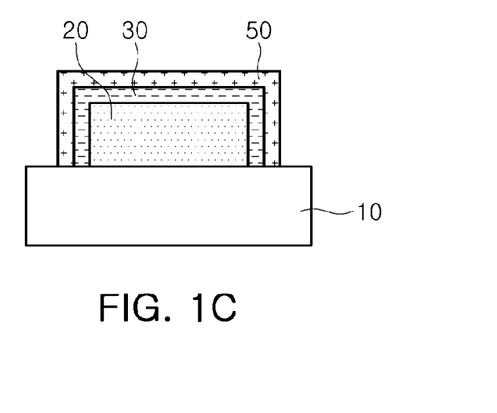

FIGS. 1A through 1C are diagrams illustrating cross sections of an electrode pad.

Referring to FIG. 1A, a connection terminal part 20 formed of copper (Cu) may be formed on an insulating substrate 10. Further, a first plating layer 30 formed of palladium (Pd) may be formed on the connection terminal part 20.

Referring to FIG. 1B, the connection terminal part 20 formed of copper (Cu) may be formed on the insulating substrate 10. Further, the first plating layer 30 formed of palladium (Pd) may be formed on the connection terminal part 20. Further, a second plating layer 40 formed of gold (Au) may be formed on the first plating layer 30.

An inner side of the first plating layer 30 contacts an outer side of the connection terminal part 20. Further, an inner side of the second plating layer 40 contacts an outer side of the first plating layer 30.

The second plating layer may be bonded to solder or may be used for wire bonding. Further, the first plating layer may be bonded to solder or may be used for wire bonding.

As described above, the first plating layer 30 formed of palladium (Pd) may be formed on the connection terminal part 20. In the case of a pure palladium (Pd) plating solution, reactivity is low in terms of plating solution characteristics. Therefore, when the first plating layer 30 is formed on the connection terminal part 20 using the pure palladium (Pd) plating solution, a skip plating phenomenon in which a plating layer is not formed may easily occur.

In order to suppress the skip plating phenomenon, there is a need to increase an initial reaction speed. In this case, in order to increase the initial reaction speed, a catalyst deposition time may be increased or catalyst reactivity may be increased.

However, when the catalyst deposition time is increased and catalyst reactivity is increased, an excessive substitution reaction may occur due to the catalyst. The substitution reaction may cause a corrosion of the connection terminal part 20 formed of copper (Cu). Further, the substitution reaction may cause a void between the connection terminal part 20 and the first plating layer formed of palladium (Pd).

Referring to FIG. 1C, the connection terminal part 20 formed of copper (Cu) may be formed on the insulating substrate 10. Further, the first plating layer 30 formed of palladium phosphorus (Pd—P) may be formed on the connection terminal part 20. Further, the second plating layer 40 formed of gold (Au) may be formed on the first plating layer 30.

The inner side of the first plating layer 30 contacts the outer side of the connection terminal part 20. Further, the inner side of the second plating layer 40 contacts the outer side of the first plating layer 30.

The second plating layer may be bonded to solder or may be used for wire bonding.

However, since the first plating layer reacts with oxygen in the air and thus, can easily be oxidized, the first plating layer is not appropriate to be bonded to the solder or used for the wire bonding.

As described above, the first plating layer 30 formed of palladium phosphorus (Pd—P) may be formed on the connection terminal part 20. In the case of a palladium phosphorus (Pd—P) plating solution, reactivity is high in terms of plating solution characteristics. Therefore, when the first plating layer 30 is formed on the connection terminal part 20 using the palladium phosphorus (Pd—P) plating solution, the palladium phosphorus (Pd—P) plating solution may react with a palladium (Pd) catalyst or a copper (Cu) residue that may be adsorbed at the time of plating chemical copper on the insulating substrate. Further, as a plating reaction time is relatively long, the palladium phosphorus (Pd—P) plating solution more reacts with the palladium (Pd) catalyst or the copper (Cu) residue.

Therefore, when an electrode pad requiring a thick palladium (Pd) layer is manufactured, it is highly likely to cause an excessive plating defect that disperses the palladium (Pd) plating layer.

Figure 2A:
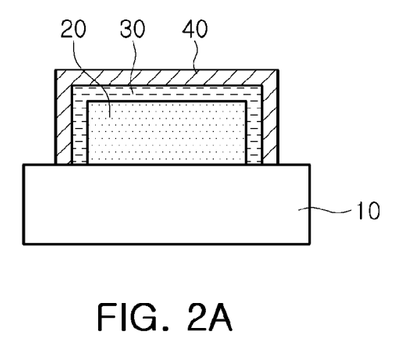
FIGS. 2A and 2B are diagrams illustrating cross sections of an electrode pad according to an embodiment of the present invention.
Figure 2B:
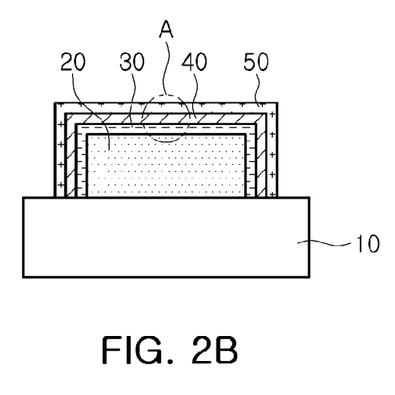

FIGS. 2A and 2B are diagrams illustrating cross sections of an electrode pad according to an embodiment of the present invention.

Referring to FIG. 2A, the connection terminal part 20 may be formed on the insulating substrate 10.

The insulating substrate 10 may be formed of a material commonly used to manufacture printed circuit boards. For example, the insulating substrate 10 may have a structure in which a reinforcing material is impregnated in a resin layer. The resin layer may be formed of an insulating resin. Further, as the reinforcing material, a glass fiber may be used.

The connection terminal part 20 may be formed of copper (Cu).

Further, the first plating layer 30 formed of palladium phosphorus (Pd—P) may be formed on the connection terminal part 20.

Referring to FIG. 2A, the first plating layer 30 formed of palladium phosphorus (Pd—P) may be formed on the insulating substrate 10 and the outer side of the connection terminal part 20.

A content of phosphorus (P) included in the palladium phosphorus (Pd—P) may be 0.1 to 6 wt %.

This is because that when the content of the phosphorus (P) is 6 wt % or more, phosphorus (P) oxide is formed on the surface of the palladium-phosphorus (Pd—P) plating layer to degrade adhesion of a subsequently formed plating layer.

A thickness of the first plating layer may be 0.01 to 0.5 μm.

This is because that when the thickness of the first plating layer is 0.5 μm or more, it is highly likely to increase the excessive plating defect that disperses the palladium (Pd) plating layer.

According to an embodiment of the present invention, the palladium (Pd) plating layer is not formed on the connection terminal part 20 and therefore, the occurrence of skip plating and voids may be suppressed.

Further, the occurrence of excessive plating defect can be suppressed by appropriately controlling the thickness of the palladium phosphorus (Pd—P) playing layer.

Meanwhile, the second plating layer 40 formed of palladium (Pd) may be formed on the first plating layer 30.

Referring to FIG. 2A, the second plating layer 40 formed of palladium (Pd) may be formed on the insulating substrate 10 and the outer side of the first plating layer 30.

A thickness of the second plating layer 40 may be 0.01 to 0.5 μm.

This is because that when the thickness of the second plating layer 40 is 0.5 μm or more, $PdSn_4$ and $AuSn_4$ may be formed on a bonding surface. The $PdSn_4$ and $AuSn_4$ may degrade solder bonding performance.

The second plating layer 40 may be bonded to the solder or may be used for wire bonding.

According to the embodiment of the present invention, the second plating layer 40 may be used for solder bonding or wire bonding even in the case in which a separate plating layer is not further formed.

Referring to FIG. 2B, a third plating layer 50 formed of gold (Au) may be formed on the second plating layer 40. That is, the third plating layer 50 formed of gold (Au) may be formed on the insulating substrate 10 and the outer side of the second plating layer 40.

A thickness of the third plating layer 50 may be 0.01 to 0.5 μm.

This is because that when the thickness of the third plating layer 50 is 0.5 μm or more, $PdSn_4$ and $AuSn_4$ may be formed on the bonding surface. The $PdSn_4$ and $AuSn_4$ may degrade the solder bonding performance.

The third plating layer 50 may be bonded to the solder or may be used for wire bonding.

FIGS. 3A through 3E are diagrams illustrating a method of manufacturing a printed circuit board according to an embodiment of the present invention.

Figure 3A:
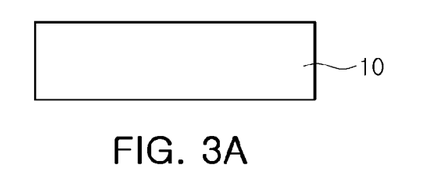
FIGS. 3A through 3E are diagrams illustrating a method of manufacturing a printed circuit board according to an embodiment of the present invention.

As illustrated in FIG. 3A, the insulating substrate 10 may be prepared.

Figure 3B:
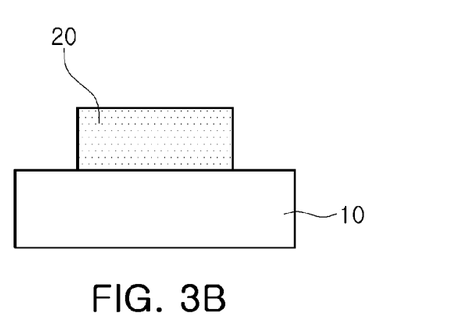

Referring to FIG. 3B, the connection terminal part 20 may be formed on the insulating substrate 10.

For example, the connection terminal part 20 may be formed by copper plating.

Figure 3C:
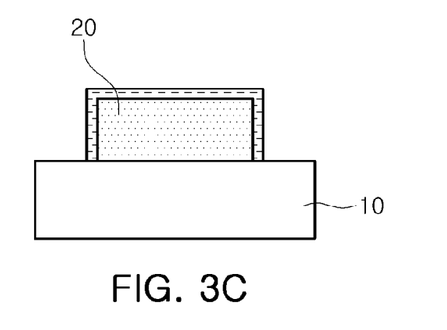

Referring to FIG. 3C, the palladium phosphorus (Pd—P) plating solution is used and thus, the first plating layer 30 including palladium phosphorus may be formed (Pd—P) on the insulating substrate 10 and the outer side of the connection terminal part 20 by an electroplating scheme or an electroless plating scheme.

Figure 3D:
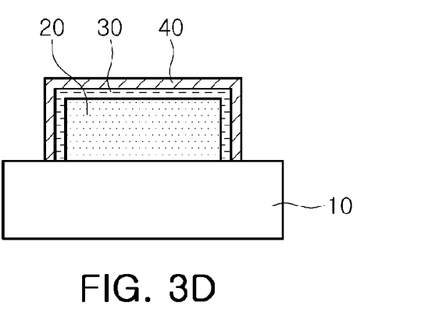

Referring to FIG. 3D, the palladium (Pd) plating solution is used and thus, the second plating layer 40 including palladium (Pd) may be formed on the insulating substrate 10 and the outer side of the first plating layer 30 by the electroplating scheme or the electroless plating scheme.

Figure 3E:
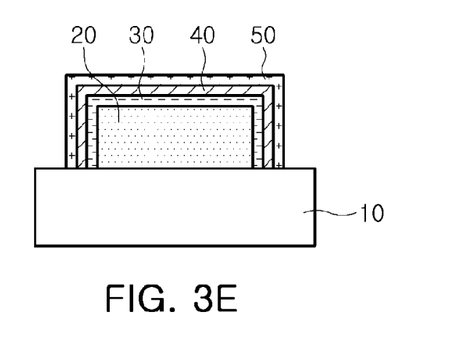

Referring to FIG. 3E, a gold (Au) plating solution is used and thus, the third plating layer 50 including gold (Au) may be formed on the insulating substrate 10 and the outer side of the second plating layer 40 by the electroplating scheme or the electroless plating scheme.

Figure 4A:
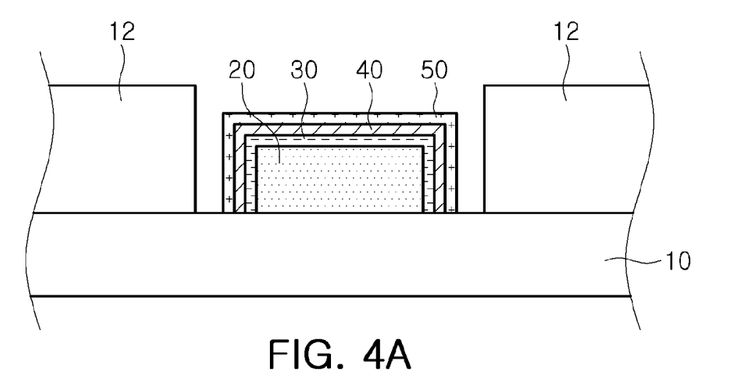
FIGS. 4A and 4B are diagrams illustrating cross sections of an electrode pad according to another embodiment of the present invention.
Figure 4B:
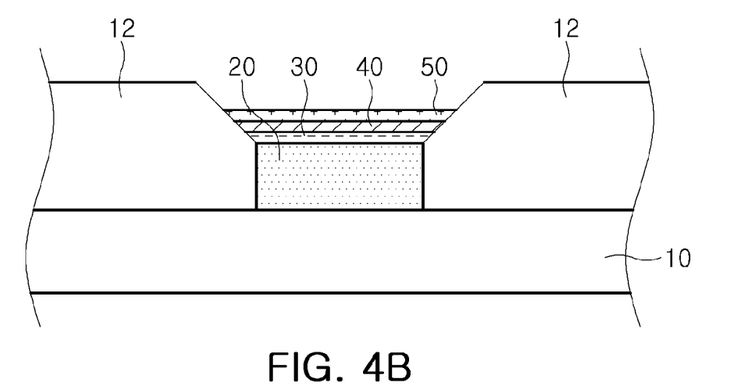

FIGS. 4A and 4B are diagrams illustrating cross sections of an electrode pad according to another embodiment of the present invention.

FIG. 4A is a cross-sectional view of an electrode pad for wire bonding of the insulating substrate 10. The electrode pad for wire bonding may be disposed between insulating members 12 and include the connection terminal part 20 including copper (Cu) mounted on one surface of the insulating substrate 10, the first plating layer 30 including palladium phosphorus (Pd—P) formed on the connection terminal part, the second plating layer 40 including palladium (Pd) formed on the first plating layer 30, and the third plating layer 50 including gold (Au) formed on the second plating layer 40.

FIG. 4B is a cross-sectional view of an electrode pad for solder bonding of the insulating substrate 10. The electrode pad for solder bonding may be disposed between the insulating members 12 and include the connection terminal part 20 including copper (Cu) mounted on one surface of the insulating substrate 10, the first plating layer 30 including palladium phosphorus (Pd—P) formed on the connection terminal part, the second plating layer 40 including palladium (Pd) formed on the first plating layer 30, and the third plating layer 50 including gold (Au) formed on the second plating layer 40.

Example

Hereinafter, the present invention will be described in more detail with reference to the Example, but the scope of the present invention is not limited to the following proposed embodiment.

Process of Manufacturing Test Substrate

A test substrate may be manufactured as follows by using a semi-additive method. A copper foil was removed from a commercially available FR-4 substrate (from PANASONIC) having a thickness of 0.5 mm and a copper foil layer of 18 μm, by etching and was subjected to surface roughening during a de-smear process as shown in Table 1.

Table 1 is a table that shows De-smear process conditions.

TABLE 1

| Process | Chemical Name | Concentration | Use Conditions |
|---------|---------------|---------------|----------------|
| Resin Etching | OPC-1200 epo-etch $KMnO_4$ | 100 ml/L 45 g/L | 75° C., 10 min. |
| Neutralization | OPC-1300 Neutralizer | 200 ml/L | 45° C., 5 min. |

OPC-1200 Epo-etch, OPC-1300 Neutralizer: From Okuno Chemical.

The electroless copper plating process was performed under conditions as shown in the following Table 2.

Table 2 is a table showing electroless copper plating pre-treating process conditions.

TABLE 2

| Process | Chemical Name | Concentration | Temperature-duration |
|---------|---------------|---------------|----------------------|
| Surface Roughening | OPC-370M Conditioner | 200 ml/L | 60° C., 5 min. |
| Soft Etching | OPC-400 Soft etch 35% Hydrogen Peroxide | 150 ml/L 100 ml/L | 25° C., 2 min. |
| De-smat | 98% Sulfric acid | 100 ml/L | 25° C., 1 min. |
| Catalyst Allocation | Neoganth MV Activator | 200 ml/L | 40° C., 5 min |
| Activation | Neoganth MV Reducer | 5 ml/L | 30° C., 3 min. |
| Chemical Copper | Printganth MV | | 35° C., 25 min. |

OPC-370M Conditoner, OPC-400 Soft etch: Okuno Chemical.
Neoganth MV Activator, Reducer, Printganth MV: ATOTECH After the plating, a pattern was formed using a dry film to perform a plating in a copper sulfate plating solution under conditions shown in Table 3, thereby removing the dry-film. Thereafter, a flash etching treatment was performed to remove chemical copper.

Table 3 is a table that shows copper sulfate process conditions.

TABLE 3

| Chemical Name | Concentration | Use Conditions |
|---------------|---------------|----------------|
| $CUSO_4 \cdot 5H_2O$ | 230 g/L | Current Density: |
| 98% $H_2SO_4$ | 50 g/L | 1.5 A/dm$^2$ |
| Chloride ion | 30 mg/L | Temperature: 25° C. |
| CU-BRIGHT-VRA | 35 ml/L | Air Agitation: |
| CU-BRIGHT-VRB | 2.5 ml/L | 1.5 L/min. |
| CU-BRIGHT-VRC | 5 ml/L | |

In the foregoing process of manufacturing a test substrate, bond fingers for wire bonding, having different spaces were manufactured on the substrate using various catalysts.

The substrate was plated in an electroless Pd/Au process as shown in Table 4 and thus, a bridge phenomenon occurring between the spaces was confirmed by an optical microscope. Further, the plating composition used is as follows.

Table 4 is a table that shows a Pd chemical composition of the electroless Pd/Au process.

TABLE 4

| Process | Electroless Pd—P Alloy Plating | | Electroless Pure Pd |
|---|---|---|---|
| | Sol. 1 | Sol. 2 | Sol. 3 |
| $PdCl_2$ | 2 g/L | 0.01 mol/L | 0.05 mol/L |
| 28% $NH_4OH$ | 160 ml/L | 200 ml/L | |
| $NH_4Cl$ | 27 g/L | | |
| Ethylenediamine | | | 0.03 mol/L |
| EDTA | | 0.01 mol/L | |
| Malic acid | | | 0.05 mol/L |
| Citric acid | | | 0.05 mol/L |
| Disodium phosphite | 10 g/L | | 0.1 mol/L |
| Sodium hypophosphite | | 0.06 mol/L | |
| Thiodiglycolic acid | | 20 mg/L | |
| Sodium formate | | | 0.3 mol/L |
| Sodium sulfate | | | 0.1 mol/L |
| Temp. | 55° C. | 55° C. | 70° C. |
| pH | 8.0 (by HCl) | 7.0 (by HCl) | 6.0 |
| P % in plating layer | ab. 0.1 | ab. 4 | Not ditect |

Sol. 1: METAL FINISHING; Vol87, No. 1, 23-27(1989)
Sol. 2: Metal Surface Technology Association Lectures, 73rd, 116-117 (1986)
Sol. 3: Embodiment 1 described in JP4117016

Table 5 is a table that shows electroless Ni/Au process.

TABLE 5

| Process | Chemical (maker) | Temperature (° C.) | Treated Time (Minute) |
|---|---|---|---|
| Cleaning | ACID CLEAN 125 (Okuno) | 45 | 5 |
| Soft-etching | $Na_2S_2O_8$ | 25 | 1 |
| Activating | ICP ACCERA H (Okuno) | 40 | 3 |
| Electroless Palladium | Table 6 | 80 | 20 |
| Immersion Gold Dry | FLASH-GOLD2000 (Okuno) | 80 | 10 |

The results obtained in the Example are shown in Tables 5 and 6.

Table 6 is a table that shows plating solutions and layer thicknesses used in multiple Comparative Examples and multiple Examples.

TABLE 6

| | Step 1 | | Step 2 | | |
|---|---|---|---|---|---|
| | Plating Solution | Layer Thickness (μm) | Plating Solution | Layer Thickness (μm) | Au Layer Thickness (μm) |
| Comparative Example 1 | Sol. 1 | 0.10 | N/A | — | 0.10 |
| Comparative Example 2 | Sol. 2 | 0.15 | N/A | — | 0.10 |
| Comparative Example 3 | Sol. 3 | 0.12 | N/A | — | 0.20 |
| Example 1 | Sol. 1 | 0.05 | Sol. 3 | 0.10 | 0.10 |
| Example 2 | Sol. 1 | 0.02 | Sol. 3 | 0.10 | 0.05 |
| Example 3 | Sol. 1 | 0.01 | Sol. 3 | 0.25 | 0.15 |
| Example 4 | Sol. 2 | 0.01 | Sol. 3 | 0.20 | 0.15 |
| Example 5 | Sol. 2 | 0.02 | Sol. 3 | 0.08 | 0.15 |

Table 7 is a diagram showing reliability and whether plating is dispersed or not in Comparative Examples and Examples.

TABLE 7

| | | | Space(μm) | | | | | | | | | Reliability | |
|---|---|---|---|---|---|---|---|---|---|---|---|---|---|
| | Void | Skip | 12 | 15 | 18 | 20 | 22 | 25 | 30 | 35 | 40 | S.J | W.B |
| Comparative Example 1 | Non-occurrence | Non-occurrence | X | X | X | X | X | X | X | X | X | Good | Good |
| Comparative Example 2 | Non-occurrence | Non-occurrence | X | X | X | X | X | Δ | Δ | ○ | ○ | Good | Good |
| Comparative Example 3 | Occurrence | Occurrence | ○ | ○ | ○ | ○ | ○ | ○ | ○ | ○ | ○ | Bad | Bad |
| Example 1 | Non-occurrence | Non-occurrence | ○ | ○ | ○ | ○ | ○ | ○ | ○ | ○ | ○ | Good | Good |
| Example 2 | Non-occurrence | Non-occurrence | ○ | ○ | ○ | ○ | ○ | ○ | ○ | ○ | ○ | Good | Good |
| Example 3 | Non-occurrence | Non-occurrence | ○ | ○ | ○ | ○ | ○ | ○ | ○ | ○ | ○ | Good | Good |
| Example 4 | Non-occurrence | Non-occurrence | ○ | ○ | ○ | ○ | ○ | ○ | ○ | ○ | ○ | Good | Good |
| Example 5 | Non-occurrence | Non-occurrence | ○ | ○ | ○ | ○ | ○ | ○ | ○ | ○ | ○ | Good | Good |

○: Bridge not confirmed

Δ: Plating dispersal around bond finger confirmed

X: Plating dispersal all over the surface confirmed

S.J.: Solder Joint

*114W.B.: WireBonding

Referring to Table 7, in the case of Comparative Examples 1 and 2, there is no defect in reliability, but plating dispersal was confirmed, such that it was confirmed that Examples 1 and 2 were not appropriate to be used as a substrate.

Further, Comparative Example 3 did not confirm plating dispersal, but caused the defect in reliability due to the occurrence of skip plating.

On the other hand, in all Examples 1 through 5, plating dispersal was not confirmed. Further, there were no defect in reliability.

In all of Examples 1 through 5, a first plating layer formed of palladium phosphorus (Pd—P) was formed on a connection terminal part and the second plating layer formed of palladium (Pd) was formed on the first plating layer.

Therefore, according to the embodiment of the present invention, it was confirmed that a skip phenomenon, a void occurrence phenomenon, and a plating dispersal phenomenon did not occur. Further, according to the embodiment of the present invention, it was confirmed that there was no defect in reliability.

As set forth above, according to the embodiments of the present invention, an electrode pad capable of suppressing the occurrence of skip plating, voids, and excessive plating, a printed circuit board using the electrode pad, and a method of manufacturing a printed circuit board can be provided.

While the present invention has been shown and described in connection with the embodiments, it will be apparent to those skilled in the art that modifications and variations can be made without departing from the spirit and scope of the invention as defined by the appended claims.

What is claimed is:

1. An electrode pad, comprising:
a connection terminal part;
a first plating layer including palladium phosphorus (Pd—P) formed on the connection terminal part; and
a second plating layer formed of pure palladium (Pd) and formed on the first plating layer.

2. The electrode pad of claim 1, wherein the connection terminal part includes copper (Cu).

3. The electrode pad of claim 2, wherein the first plating layer contacts a copper surface of the connection terminal part.

4. The electrode pad of claim 1, wherein a content of phosphorus (P) included in the palladium phosphorus (Pd—P) is 0.1 to 6 wt %.

5. The electrode pad of claim 1, wherein a thickness of the first plating layer is 0.01 to 0.5 μm.

6. The electrode pad of claim 1, wherein a thickness of the second plating layer is 0.01 to 0.5 μm.

7. The electrode pad of claim 1, further comprising a third plating layer including gold (Au) formed on the second plating layer.

8. The electrode pad of claim 7, wherein a thickness of the third plating layer is 0.01 to 0.5 μm.

9. A printed circuit board, comprising:
an insulating substrate;
a connection terminal part formed on the insulating substrate;
a first plating layer including palladium phosphorus (Pd—P) formed on the insulating substrate and an outer side of the connection terminal part; and
a second plating layer formed of pure palladium (Pd) and formed on the insulating substrate and an outer side of the first plating layer.

10. The printed circuit board of claim 9, wherein the connection terminal part includes copper (Cu).

11. The printed circuit board of claim 9, wherein a content of phosphorus (P) included in the palladium phosphorus (Pd—P) is 0.1 to 6 wt %.

12. An electrode pad, comprising:
a connection terminal part that includes copper (Cu);
a first plating layer including palladium phosphorus (Pd—P) and being in contact with a copper surface of the connection terminal part; and
a second plating layer formed of pure palladium (Pd) and formed on the first plating layer.

* * * * *

UNITED STATES PATENT AND TRADEMARK OFFICE
CERTIFICATE OF CORRECTION

| | | |
|---|---|---|
| PATENT NO. | : 8,946,911 B2 | Page 1 of 1 |
| APPLICATION NO. | : 13/706863 | |
| DATED | : February 3, 2015 | |
| INVENTOR(S) | : Pang et al. | |

It is certified that error appears in the above-identified patent and that said Letters Patent is hereby corrected as shown below:

On the title page item [73], Delete "Samsung Electro-Machanics Co., Ltd." insert -- Samsung Electro-Mechanics Co., Ltd. --, therefor.

Signed and Sealed this
Thirtieth Day of June, 2015

Michelle K. Lee
*Director of the United States Patent and Trademark Office*